United States Patent
Wu et al.

(10) Patent No.: US 7,573,954 B2
(45) Date of Patent: Aug. 11, 2009

(54) APPARATUS AND METHOD FOR COMPENSATING IQ IMBALANCE IN OFDM SYSTEM WITH CARRIER FREQUENCY OFFSET

(75) Inventors: Wen-Rong Wu, Hsin-Chu (TW); Guoren Tsai, Kao-Hsiung (TW)

(73) Assignee: MediaTek Inc., Hsin-Chu, Hsien (TW)

( * ) Notice: Subject to any disclaimer, the term of this patent is extended or adjusted under 35 U.S.C. 154(b) by 599 days.

(21) Appl. No.: 11/307,802

(22) Filed: Feb. 23, 2006

(65) Prior Publication Data
US 2006/0198475 A1 Sep. 7, 2006

(30) Foreign Application Priority Data
Mar. 4, 2005 (TW) .............................. 94106603 A

(51) Int. Cl.
*H04L 27/00* (2006.01)
(52) U.S. Cl. ...................................... 375/326; 375/324
(58) Field of Classification Search ................ 375/260, 375/316, 324, 326, 340, 344; 329/304, 345
See application file for complete search history.

(56) References Cited

U.S. PATENT DOCUMENTS

| 6,044,112 A | 3/2000 | Koslov |
| 7,020,220 B2 * | 3/2006 | Hansen ........................ 375/324 |
| 2003/0231723 A1 * | 12/2003 | Hansen ........................ 375/343 |
| 2005/0152463 A1 * | 7/2005 | DeChamps et al. ......... 375/260 |

OTHER PUBLICATIONS

A. Schuchert. R. Hasholzner, P. Antoine., "A Novel IQ Imbalance Compensation Scheme for the Reception of OFDM Signals.", IEEE Trans. On Consumer Electronics, Aug. 2001, pp. 313-318, vol. 47, No. 3.

J. Tubbax, B. Cóme, L. Van Der Perre, L. Deneire, S. Donnay, M. Engels, "Compensation of IQ imbalance in OFDM systems.", 2003 IEEE, pp. 3403-3407.

S. Fouladifard, H. Shafiee, "On Adaptive cancellation of IQ Mismatch in OFDM Receivers,", ICASSP 2003, pp. IV-564-IV-567, 2003 IEEE.

\* cited by examiner

*Primary Examiner*—Betsy L Deppe
(74) *Attorney, Agent, or Firm*—Winston Hsu

(57) ABSTRACT

An apparatus and method of an OFDM system for compensating IQ imbalance. The apparatus includes a mixer module for mixing a wireless signal to generate a pair of in-phase and quadrature-phase analog signals; an in-phase and quadrature-phase imbalance parameter estimation unit coupled to the mixer module for estimating a gain compensation value and a phase compensation value; and a signal compensation module coupled to the in-phase and quadrature-phase imbalance parameter estimation unit for compensating the pair of in-phase and quadrature-phase analog signals for gain imbalance and phase imbalance, according to the gain compensation value and the phase compensation value respectively.

11 Claims, 3 Drawing Sheets

APPARATUS AND METHOD FOR COMPENSATING IQ IMBALANCE IN OFDM SYSTEM WITH CARRIER FREQUENCY OFFSET

BACKGROUND

The invention relates to an apparatus and method for compensating IQ imbalance, and more particularly, to an apparatus and method for compensating IQ imbalance in an OFDM system when a carrier frequency offset exists.

In a normal communication system, in order to increase utilization efficiencies of the communication bandwidth, the communication bandwidth is often divided into several sub-channels and the orthogonal frequency division multiplexing (OFDM) technique is utilized to perform the signal transmissions and receptions. The above-mentioned communication system is called as OFDM communication system. For example, in the digital video broadcasting-terrestrial (DVB-T) standard, the radio signal received by the antennas of the receiver is a time-domain sequential signal composed of a plurality of OFDM symbols. In addition, the OFDM symbols can be transformed into an OFDM frequency-domain signal by a well-known Fourier transformation unit. As is known by those of average skill in the art, the OFDM frequency-domain signal is composed of a plurality of sub-carriers.

Please refer to FIG. 1, which is a diagram of an OFDM receiver 100. As shown in FIG. 1, the OFDM receiver 100 comprises an antenna 102, a low noise amplifier (LNA) 104, an in-phase mixer 106, a quadrature-phase mixer 108, a plurality of low-pass filters (LPF) 110 and 112, a plurality of analog-to-digital converters (ADC) 116 and 118, and a compensation module 114. First, the antenna 102 is utilized to receive a radio signal $R_1(t)$. The LNA 104 is utilized to amplify the radio signal $R_1(t)$ received by the antenna 102 to output a radio signal $R_2(t)$. And then, the in-phase mixer 106 is utilized to mix the radio signal $R_2(t)$ and an in-phase carrier $2\cos(2\pi f_C t)$ to generate an in-phase analog signal $R_I(t)$. Next, the quadrature-phase mixer 108 is utilized to mix the radio signal $R_2(t)$ and a quadrature-phase carrier $2\sin(2\pi f_C t)$ to generate a quadrature-phase analog signal $R_Q(t)$. Please note that the amplitude coefficient 2 of the in-phase carrier $2\cos(2\pi f_C t)$ and the quadrature-phase analog signal $2\sin(2\pi f_C t)$ is only utilized for simply illustrating the following equations. In other words, the amplitude parameter is possible to be any other values. This is not a limitation of the present invention. Next, the LPFs 110 and 112 are respectively utilized to filter out the high-frequency parts of the in-phase analog signal $R_I(t)$ and the quadrature-phase analog signal $R_Q(t)$ to output the filtered in-phase analog signal $R'_I(t)$ and filtered quadrature-phase analog signal $R'_Q(t)$. Finally, the ADCs 116 and 118 are respectively utilized to convert the in-phase analog signal $R'_I(t)$ and the quadrature-phase analog signal $R'_Q(t)$ into digital signals $R'_I[n]$ and $R'_Q[n]$. The digital signals $R'_I[n]$ and $R'_Q[n]$ are inputted into the compensation module 114 to perform related signal processing.

As known by those skilled in the art, the above-mentioned in-phase carrier $2\cos(2\pi f_C t)$ and the quadrature-phase carrier $2\sin(2\pi f_C t)$ ideally correspond to a 90-degree phase difference such that the mixed in-phase analog signal $R_I$ and the mixed quadrature-phase analog signal $R_Q$ can be orthogonal. However, in the actual circuit, some factors such as, temperature, manufacturing procedure, and the supplying voltage shift, may cause a gain imbalance and a phase imbalance of the in-phase carrier $2\cos(2\pi f_C t)$ and the quadrature-phase carrier $2\sin(2\pi f_C t)$. This also causes a gain imbalance and a phase imbalance of the mixed in-phase analog signal $R_I$ and the mixed quadrature-phase analog signal $R_Q$. In general, omitting the influences caused by the gain of the LNA 104 and related noises, the radio signal $R_2(t)$ input into the in-phase mixer 106 and the quadrature mixer 108 can be represented by the following equation as:

$$R_2(t) = \mathrm{Re}\{[r_I(t) + jr_Q(t)]e^{j2\pi f_C t}\} \quad \text{Equation (1)}$$

In equation (1), $r_I(t)$ represents an in-phase analog signal transmitted by a transmitter (not shown), and $r_Q(t)$ represents a quadrature-phase analog signal transmitted by the transmitter. At this time, please consider the influences of a gain imbalance $\epsilon$ and a phase imbalance $\theta$ on the OFDM receiver 100 when the in-phase mixer 106 receives an in-phase carrier $2\cos(2\pi f_C t)$ and the quadrature-phase mixer 108 receives the quadrature-phase mixer $-2(1+\epsilon)\sin(2\pi f_C t+\theta)$. Therefore, the in-phase analog signal $R_I(t)$ and the quadrature-phase $R_Q(t)$ generated by the OFDM receiver 100 can be represented by the following equation as:

$$\begin{aligned}R_I(t) &= \mathrm{Re}\{[r_I(t) + jr_Q(t)]e^{j2\pi f_c t}\} \cdot 2\cos(2\pi f_c t) \quad \text{Equation (2)}\\ &= 2r_I(t)\cos(2\pi f_c t)\cos(2\pi f_c t) - \\ &\quad 2r_Q(t)\sin(2\pi f_c t)\cos(2\pi f_c t)\\ &= r_I(t) + r_I(t)\cos(4\pi f_c t) - r_Q(t)\sin(4\pi f_c t)\end{aligned}$$

$$\begin{aligned}R_Q(t) &= \mathrm{Re}\{(r_I(t) + jr_Q(t))e^{j2\pi f_c t}\} \cdot \quad \text{Equation (3)}\\ &\quad (-2(1+\varepsilon)\sin(2\pi f_c t + \theta))\\ &= 2(1+\varepsilon)(-r_I(t)\cos(2\pi f_c t)\sin(2\pi f_c t + \theta) + \\ &\quad r_Q(t)\sin(2\pi f_c t)\sin(2\pi f_c t + \theta))\\ &= (1+\varepsilon)(-r_I(t)\sin(\theta) - r_I(t)\sin(4\pi f_c t + \theta) + \\ &\quad r_Q(t)\cos(\theta) - r_Q(t)\cos(4\pi f_c t + \theta))\end{aligned}$$

It can be determined utilizing the equations (2) and (3) that after the LPFs 110 and 112 filter out the high-frequency parts of the in-phase analog signal $R_I(t)$ and the quadrature-phase $R_Q(t)$, that the in-phase analog signal $R'_I(t)$ and the quadrature-phase analog signal $R'_Q(t)$ can be represented by the following equation as:

$$R'_I(t) = r_I(t) \quad \text{Equation (4)}$$

$$R'_Q(t) = (1+\epsilon)[r_Q(t)\cos\theta - r_I(t)\sin\theta] \quad \text{Equation (5)}$$

Furthermore, after being digitized by the ADCs 116 and 118, the in-phase digital signal $R'_I[n]$ and the quadrature-phase digital signal $R'_Q[n]$ can be represented by the following equations as:

$$R'_I[n] = r_I[n] \quad \text{Equation (6)}$$

$$R'_Q[n] = (1+\epsilon)[r_Q[n]\cos\theta - r_I[n]\sin\theta] \quad \text{Equation (7)}$$

In the related art, methods utilized in the OFDM receiver to compensating for the IQ imbalance comprise: (1) Utilize an adaptive frequency-domain equalizer (AFEQ). This reference can be found in the paper by A. Schuchert, R. Hasholzner, "A Novel IQ Imbalance Compensation Scheme for the Reception of OFDM Signals," IEEE Trans. On Consumer Electronics, Vol. 43, No. 3, August 1998. (2) Utilize an adaptive time-domain compensator (ATDC). This can be referred to as a paper S. Fouladifard, H. Shafiee, "On Adaptive cancellation of IQ Mismatch in OFDM Receivers," Proc. ICASSP 2003 IEEE International Conference on, Vol. 4, 6-10 April 2003 Pages: IV-564-7. (3) Utilize a decision feedback correction scheme (DFCS). This can be refer to as a paper J. Tubbax, B. Come, L. Van der Perre, L. Deneire, S. Donnay, M. Engels, "Compensation of IQ imbalance in OFDM systems," Communications, 2003. ICC '03. IEEE International Conference on, Volume: 5, 11-15 May 2003 Pages: 3403-3407.

Because the above-mentioned mechanisms for compensating IQ imbalance are well-known by those skilled in the art, descriptions of the detailed circuit and operations are omitted here. However, the above-mentioned mechanisms for compensating IQ imbalance never mention the negative influences of the carrier frequency offset. In fact, the carrier frequency offset and the IQ imbalance both contribute to ruining the orthogonal properties of sub-carriers in the OFDM system. A main reason that the carrier frequency offset exists is the imbalance between the oscillator of the transmitter and the mixer of the receiver. A secondary cause of the carrier frequency offset is the Doppler shift generated because of the corresponding movements between the transmitter and the receiver.

While considering the carrier frequency offset and the IQ imbalance individually, the compensation of the carrier frequency offset and the IQ imbalance each requires its own method. However, while the two effects both exist, there is no one method to simultaneously solve the two problems. As a result, the compensation performance is degraded. The above-mentioned three IQ imbalance compensation mechanisms can be utilized to solve only the IQ imbalance, however, they cannot solve the carrier frequency offset imbalance. Therefore, if the characteristic of the circuit further comprises the carrier frequency offset, the above-mentioned three IQ imbalance compensation mechanisms are insufficient. Therefore, when the in-phase carrier of the in-phase mixer 106 and the quadrature-phase carrier of the quadrature-phase mixer 108 have the carrier frequency offset, according to related experiments, the OFDM 100 cannot compensate the gain imbalance $\epsilon$ and the phase imbalance $\theta$ by utilizing the above-mentioned three ways of compensation. In other words, if the carrier frequency offset exists, the efficiency of the above-mentioned three ways of compensation will be decreased enormously.

SUMMARY

It is therefore one of the primary objectives of the claimed invention to provide an apparatus and method for compensating IQ mismatch in an OFDM system while a carrier frequency offset exists at the same time, to solve the above-mentioned problem.

According to an exemplary embodiment of the claimed invention, a method for compensating IQ imbalance is disclosed. The method is utilized for compensating a phase imbalance and a gain imbalance between an in-phase carrier and a quadrature-phase carrier, and the method comprises: respectively mixing a ratio frequency signal according to the in-phase carrier and quadrature-phase carrier to generate an in-phase analog signal and a quadrature-phase analog signal, wherein a frequency offset is between a carrier frequency of the RF signal and a frequency of the in-phase carrier and the frequency offset is also between the carrier frequency of the RF signal and a frequency of the RF signal; calculating a gain compensation value and a phase compensation value according to the in-phase analog signal and the quadrature-phase signal; and utilizing the gain compensation value to compensate the gain imbalance and utilizing the phase compensation value to compensate the phase imbalance.

According to another exemplary embodiment of the claimed invention, a receiver capable of compensating IQ imbalance is disclosed. The receiver is utilized for compensating a gain imbalance and a phase imbalance between an in-phase carrier and a quadrature-phase carrier, and the receiver comprises: a mixer module respectively mixing an RF signal according to the in-phase carrier and the quadrature-phase carrier in order to generate an in-phase analog signal and a quadrature-phase analog signal, wherein a frequency offset is between a carrier frequency of the RF signal and a frequency of the in-phase carrier, and the frequency offset is between the carrier frequency of the RF signal and a frequency of the quadrature-phase carrier; an in-phase and quadrature-phase imbalance parameter estimation unit, coupled to the mixer module, for estimating a gain compensation value and a phase compensation value according to the in-phase analog signal and the quadrature-phase analog signal; and a signal compensation module, coupled to the in-phase and quadrature-phase imbalance parameter estimation unit, for utilizing the gain compensation value to compensate the gain imbalance and for utilizing the phase compensation value to compensate the phase imbalance.

The present invention method and receiver capable of compensating the IQ imbalance effectively estimates a gain imbalance and a phase imbalance when a carrier frequency offset exists. Furthermore, the present invention method and receiver capable of compensating the IQ imbalance utilizes an inverse matrix to multiply an in-phase analog signal and a quadrature-phase analog signal output by a mixer module in order to eliminate the IQ imbalance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
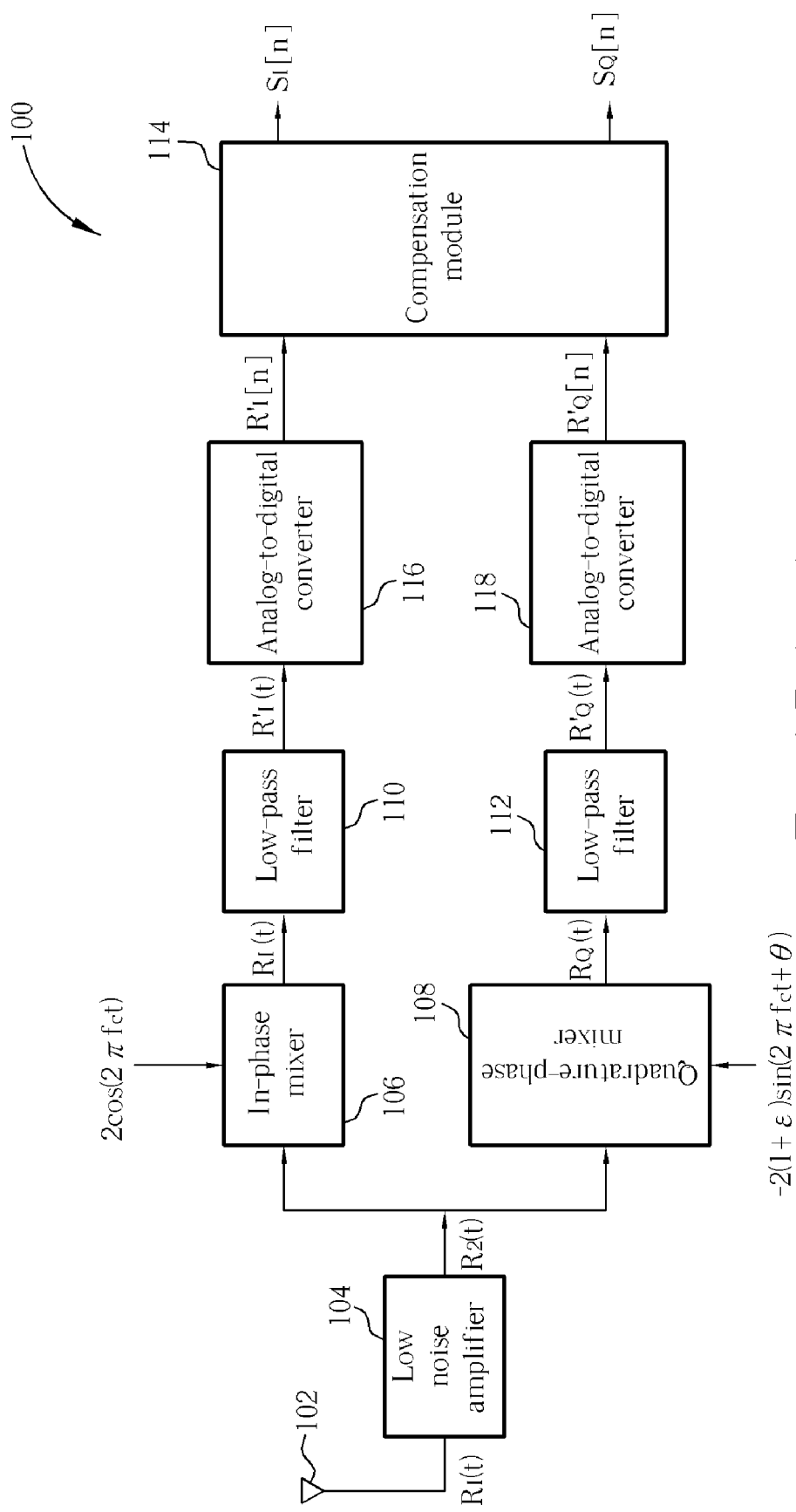
FIG. 1 is a diagram of an OFDM receiver according to the related art.
Figure 2:
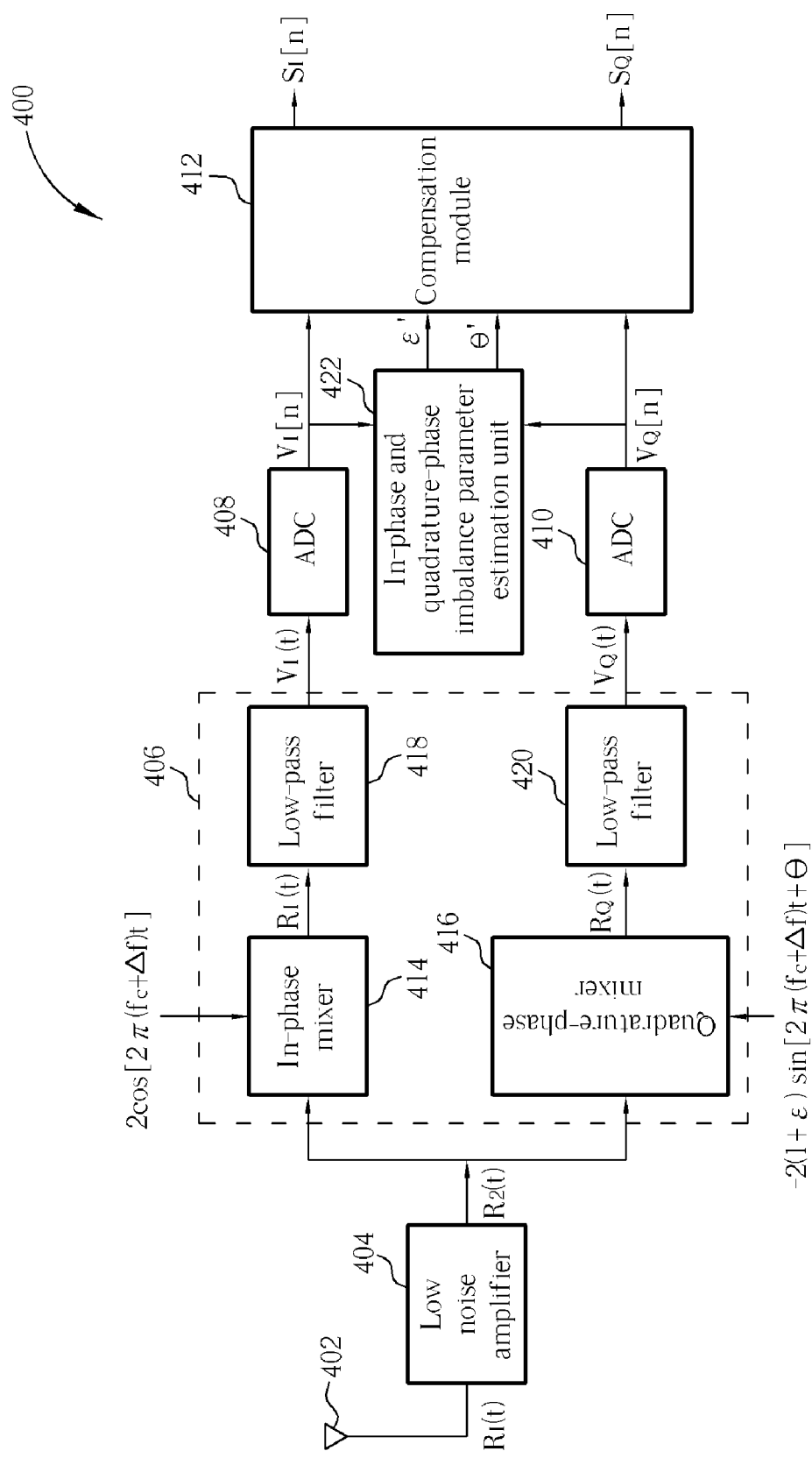
FIG. 2 is a diagram of a receiver capable of compensating IQ imbalance of an embodiment according to the present invention.

Please refer to FIG. 2 a functional diagram of the present invention, which is a receiver 400 capable of compensating IQ imbalance while at the same time a carrier frequency offset also exists. As shown in FIG. 2, the receiver 400 comprises an antenna 402, an LNA 404, a mixer module 406, a plurality of ADCs 408 and 410, an in-phase and quadrature-phase imbalance parameter estimation unit 422, and a compensation module 412. The antenna 402 is utilized to receive a radio signal $R_1(t)$, and the LNA 404 is utilized to amplify the radio signal $R_1(t)$ received by the antenna 402 in order to output a radio signal $R_2(t)$. Next, the mixer module 406 generates an in-phase analog signal $V_I(t)$ and a quadrature-phase analog signal $V_Q(t)$ according to the radio signal $R_2(t)$. After the in-phase analog signal $V_I(t)$ and the quadrature-phase analog signal $V_Q(t)$ are digitized by the ADCs 408 and 410, an in-phase digital signal $V_I[n]$ and a quadrature-phase digital signal $V_Q[n]$ are generated respectively. In this embodiment, the in-phase and quadrature-phase imbalance parameter estimation unit 422 estimates a gain compensation value $\epsilon'$ and a phase compensation value $\theta'$ according to the in-phase digital signal $V_I[n]$ and the quadrature-phase digital signal $V_Q[n]$. Finally, the compensation module 412 compensates the gain imbalance and the phase imbalance of the in-phase digital signal $V_I[n]$ and the quadrature-phase digital signal $V_Q[n]$ according to the gain compensation value $\epsilon'$ and the phase compensation value $\theta'$.

As shown in FIG. 2, the mixer module 406 comprises an in-phase mixer 414, a quadrature-phase mixer 416, and a plurality of LPFs 418 and 420. Consider that the receiver 400 compensates the IQ imbalance while the carrier frequency offset $\Delta f$ also exists at the same time. Assuming that the carrier frequency offset $\Delta f$ and the IQ imbalance (including the gain imbalance $\epsilon$ and the phase imbalance $\theta$) both exist, the system model is illustrated as follows. First, the in-phase mixer 414 receives an in-phase carrier 2 cos [2π($f_C$+Δf)t], and the quadrature-phase mixer 414 receives a quadrature-phase carrier –2(1+ε)sin [2π($f_C$+Δf)t+θ]. In this embodiment, the in-phase mixer 414 mixes the radio signal $R_2$(t) and the in-phase carrier 2 cos [2π($f_C$+Δf)t] to generate an in-phase analog signal $R_I$(t), and the quadrature-phase mixer 416 mixes the radio signal $R_2$(t) and the quadrature-phase carrier –2(1+ε)sin [2π($f_C$+Δf)t+θ] to generate a quadrature-phase analog signal $R_Q$(t). Please note that in the following description, an exemplary amplitude coefficient 2 of the in-phase carrier 2 cos [2π($f_C$+Δf)t] and the quadrature-phase carrier –2(1+ε)sin [2π($f_C$+Δf)t+θ] is only for simplifying the description, which in fact could be any other values. This is not a limitation of the present invention. Finally, the LPFs 418 and 420 are respectively utilized to filter out the high-frequency parts of the in-phase analog signal $R_I$(t) and the quadrature-phase analog signal $R_Q$(t) in order to output filtered in-phase analog signal $V_I$(t) and filtered quadrature-phase analog signal $V_Q$(t). And after the filtered in-phase analog signal $V_I$(t) and filtered quadrature-phase analog signal $V_Q$(t) are digitized by the ADCs 408 and 410, the in-phase digital signal $V_I$[n] and the quadrature-phase digital signal $V_Q$[n] are generated.

As in usual cases, the noise induced by the LNA 404 is omitted in the following analysis. The radio signal $R_2$(t) input to the mixer module 406 can be represented by the above-mentioned equation (1). Therefore, the in-phase analog signal $R_I$(t) and the quadrature-phase analog signal $R_Q$(t) output by the in-phase mixer 414 and the quadrature-phase mixer 416 can be represented by the following equations:

$$\begin{aligned}R_I(t) &= \text{Re}\{[r_I(t)+jr_Q(t)]e^{j2\pi f_c t}\} \cdot 2\cos(2\pi(f_c+\Delta f)t) \quad \text{Equation (8)}\\ &= 2r_I(t)\cos(2\pi f_c t)\cos(2\pi(f_c+\Delta f)t) - \\ &\quad 2r_Q(t)\sin(2\pi f_c t)\cos(2\pi(f_c+\Delta f)t)\\ &= r_I(t)\cos(2\pi\Delta ft) + r_I(t)\cos(2\pi(2f_c+\Delta f)t) + \\ &\quad r_Q(t)\sin(2\pi\Delta ft) - r_Q(t)\sin(2\pi(2f_c+\Delta f)t)\end{aligned}$$

$$\begin{aligned}R_Q(t) &= \text{Re}\{(r_I(t)+jr_Q(t))e^{j2\pi f_c t}\} \cdot \quad \text{Equation (9)}\\ &\quad (-2(1+\varepsilon)\sin(2\pi(f_c+\Delta f)t+\theta))\\ &= 2(1+\varepsilon)(-r_I(t)\cos(2\pi f_c t)\sin(2\pi(f_c+\Delta f)t+\theta) + \\ &\quad r_Q(t)\sin(2\pi f_c t)\sin(2\pi(f_c+\Delta f)t+\theta))\\ &= (1+\varepsilon)(-r_I(t)\sin(2\pi\Delta ft+\theta) - \\ &\quad r_I(t)\sin(2\pi(2f_c+\Delta f)t+\theta) + \\ &\quad r_Q(t)\cos(2\pi\Delta ft+\theta) - r_Q(t)\cos(2\pi(2f_c+\Delta f)t+\theta))\end{aligned}$$

From the above-mentioned equations (8) and (9), it can be seen that after the LPFs 418 and 420 filtering out the high-frequency parts of the in-phase analog signal $R_I$(t) and the quadrature-phase analog signal $R_Q$(t), the in-phase analog signal $V_I$(t) and the quadrature-phase analog signal $V_Q$(t) can be respectively represented by the following equations:

$$V_I(t) = r_I(t)\cos(2\pi\Delta ft) + r_Q(t)\sin(2\pi\Delta ft) \quad \text{Equation (10)}$$

$$\begin{aligned}V_Q(t) &= (1+\varepsilon)[r_Q(t)\cos(2\pi\Delta ft+\theta) - r_I(t)\sin(2\pi\Delta ft+\theta)] \quad \text{Equation (11)}\\ &= (1+\varepsilon)[r_Q(t)\cos(2\pi\Delta ft)\cos(\theta) - \\ &\quad r_Q(t)\sin(2\pi\Delta ft)\sin(\theta) - r_I(t)\sin(2\pi\Delta ft)\cos(\theta) - \\ &\quad r_I(t)\cos(2\pi\Delta ft)\sin(\theta)]\\ &= (1+\varepsilon)((r_Q(t)\cos(2\pi\Delta ft) - r_I(t)\sin(2\pi\Delta ft))\cos(\theta) - \\ &\quad V_I(t)\sin(\theta))\end{aligned}$$

In equations (8)-(11), $r_I$(t) represents an in-phase analog signal transmitted by a transmitter (not shown), and $r_Q$(t) represents a quadrature-phase analog signal transmitted by the transmitter.

In this embodiment, the in-phase and quadrature-phase imbalance parameter estimation unit 422 estimates the gain compensation value ε' according to a first predetermined functional relationship between $(1+ε)^2$ and a power value ($V_I^2$[n]) of the in-phase digital signal $V_I$[n] and a power value ($V_Q^2$[n]) of the quadrature-phase digital signal $V_Q$[n]. Furthermore, the in-phase and quadrature-phase imbalance parameter estimation unit 422 estimates the desired phase compensation value θ' according to a second predetermined functional relationship between $-(1+ε)·E(V_I^2[n])·\sin θ$ and a product of the in-phase digital signal $V_I$[n] and the quadrature-phase digital signal $V_Q$[n].

Generally speaking, the in-phase analog signal $r_I$(t) and the quadrature-phase analog signal $r_Q$(t) transmitted by the transmitter are uncorrelated in statistic characteristic. Furthermore, the power of the in-phase analog signal $r_I$(t) and the quadrature-phase analog signal $r_Q$(t) transmitted by the transmitter are equal. Therefore, the equations (12) and (13) can be obtained as follows:

$$E(r_I(t) \cdot r_Q(t)) = 0 \quad \text{Equation (12)}$$

$$E(r_I^2(t)) = E(r_Q^2(t)) \quad \text{Equation (13)}$$

In equations (12) and (13), E(x) represents the expectation value of X.

From the equations (10), (11), (12), and (13), we can determine that:

$$\begin{aligned}E(V_I^2(t)) &= E((r_I(t)\cos(2\pi\Delta ft) + r_Q(t)\sin(2\pi\Delta ft))^2) \quad \text{Equation (14)}\\ &= E(r_I^2(t)\cos^2(2\pi\Delta ft) + r_Q^2(t)\sin^2(2\pi\Delta ft) + \\ &\quad 2r_I(t)r_Q(t)\cos(2\pi\Delta ft)\sin(2\pi\Delta ft))\\ &= E(r_I^2(t))E(\cos^2(2\pi\Delta ft)) + \\ &\quad E(r_Q^2(t))E(\sin^2(2\pi\Delta ft)) + \\ &\quad 2E(r_I(t)r_Q(t))E(\cos(2\pi\Delta ft)\sin(2\pi\Delta ft))\\ &= E(r_I^2(t))\end{aligned}$$

$$\begin{aligned}E(V_Q^2(t)) &= E((1+\varepsilon)^2[r_Q(t)\cos(2\pi\Delta ft+\theta) - \quad \text{Equation (15)}\\ &\quad r_I(t)\sin(2\pi\Delta ft+\theta)]^2)\\ &= (1+\varepsilon)^2 E(r_I^2(t))\end{aligned}$$

The following equation is derived according to the equations (14) and (15):

$$\frac{E(V_Q^2(t))}{E(V_I^2(t))} = (1+\varepsilon)^2 \quad \text{Equation (16)}$$

Therefore, from the equation (16), the gain imbalance ε is:

$$\varepsilon = \left[\frac{E(V_Q^2(t))}{E(V_I^2(t))}\right]^{\frac{1}{2}} - 1 \quad \text{Equation (17)}$$

In addition, according to the above-mentioned equations (10), (11), and (13), the cross-correlation between the in-phase analog signal $V_I$(t) and the quadrature-phase analog signal $V_Q$(t) is:

$$E(V_I(t)V_Q(t)) = E((r_I(t)\cos(2\pi\Delta ft) + r_Q(t)\sin(2\pi\Delta ft))$$

$$(1+\varepsilon)(r_Q(t)\cos(2\pi\Delta ft + \theta) -$$

$$r_I(t)\sin(2\pi\Delta ft + \theta)))$$

$$= (1+\varepsilon)(-E(r_I^2(t)\cos(2\pi\Delta ft)\sin(2\pi\Delta ft + \theta)) +$$

$$E(r_Q^2(t)\sin(2\pi\Delta ft)\cos(2\pi\Delta ft + \theta)))$$

$$= (1+\varepsilon)E(r_I^2(t))(E(-\cos(2\pi\Delta ft)$$

$$(\sin(2\pi\Delta ft)\cos\theta + \cos(2\pi\Delta ft)\sin\theta)) +$$

$$E(\sin(2\pi\Delta ft)(\cos(2\pi\Delta ft)\cos\theta -$$

$$\sin(2\pi\Delta ft)\sin\theta)))$$

$$= (1+\varepsilon)E(r_I^2(t))(-E(\cos^2(2\pi\Delta ft)\sin\theta) -$$

$$E(\sin^2(2\pi\Delta ft)\sin\theta))$$

$$= -(1+\varepsilon)E(r_I^2(t))\sin\theta$$

Equation (18)

Therefore, the phase imbalance θ can be obtained as follows:

$$\theta = \sin^{-1}\left(\frac{-E(V_I(t)\cdot V_Q(t))}{(1+\varepsilon)E(r_I^2(t))}\right) = \sin^{-1}\left(\frac{-E(V_I(t)\cdot V_Q(t))}{(1+\varepsilon)E(V_I^2(t))}\right)$$

Equation (19)

Please note that the value of $E(r_I^2(t))$ is equal to $E(V_I^2(t))$, in this embodiment, the phase compensation module 410 uses the equation (19), wherein $E(r_I^2(t))$ is substituted by $E(V_I^2(t))$, to calculate the phase compensation value θ'.

After the gain imbalance ε and the phase imbalance θ both obtained, the influences of the gain imbalance ε and the phase imbalance θ on the in-phase analog signal $V_I(t)$ and the quadrature-phase analog signal $V_Q(t)$ are eliminated accordingly. Signals without the influences of the gain imbalance ε and the phase imbalance θ are expressed as following:

$$S_I(t) = r_I(t)\cos(2\pi\Delta ft) + r_Q(t)\sin(2\pi\Delta ft)$$ Equation (20)

$$S_Q(t) = r_Q(t)\cos(2\pi\Delta ft) - r_I(t)\sin(2\pi\Delta ft)$$ Equation (21)

From the equations (10) and (11), the signals $S_I(t)$, $S_Q(t)$ and $V_I(t)$, $V_Q(t)$ have the following relationship:

$$V_I(t) = S_I(t)$$ Equation (22)

$$V_Q(t) = (1+\varepsilon)(S_Q(t)\cos(\theta) - S_I(t)\sin(\theta))$$ Equation (23)

The following equations (24) and (25) can be obtained from equations (22) and (23):

$$S_I(t) = V_I(t)$$ Equation (24)

$$S_Q(t) = \frac{1}{\cos(\theta)}\left(\frac{V_Q(t)}{1+\varepsilon} + V_I(t)\sin(\theta)\right)$$ Equation (25)

Figure 3:
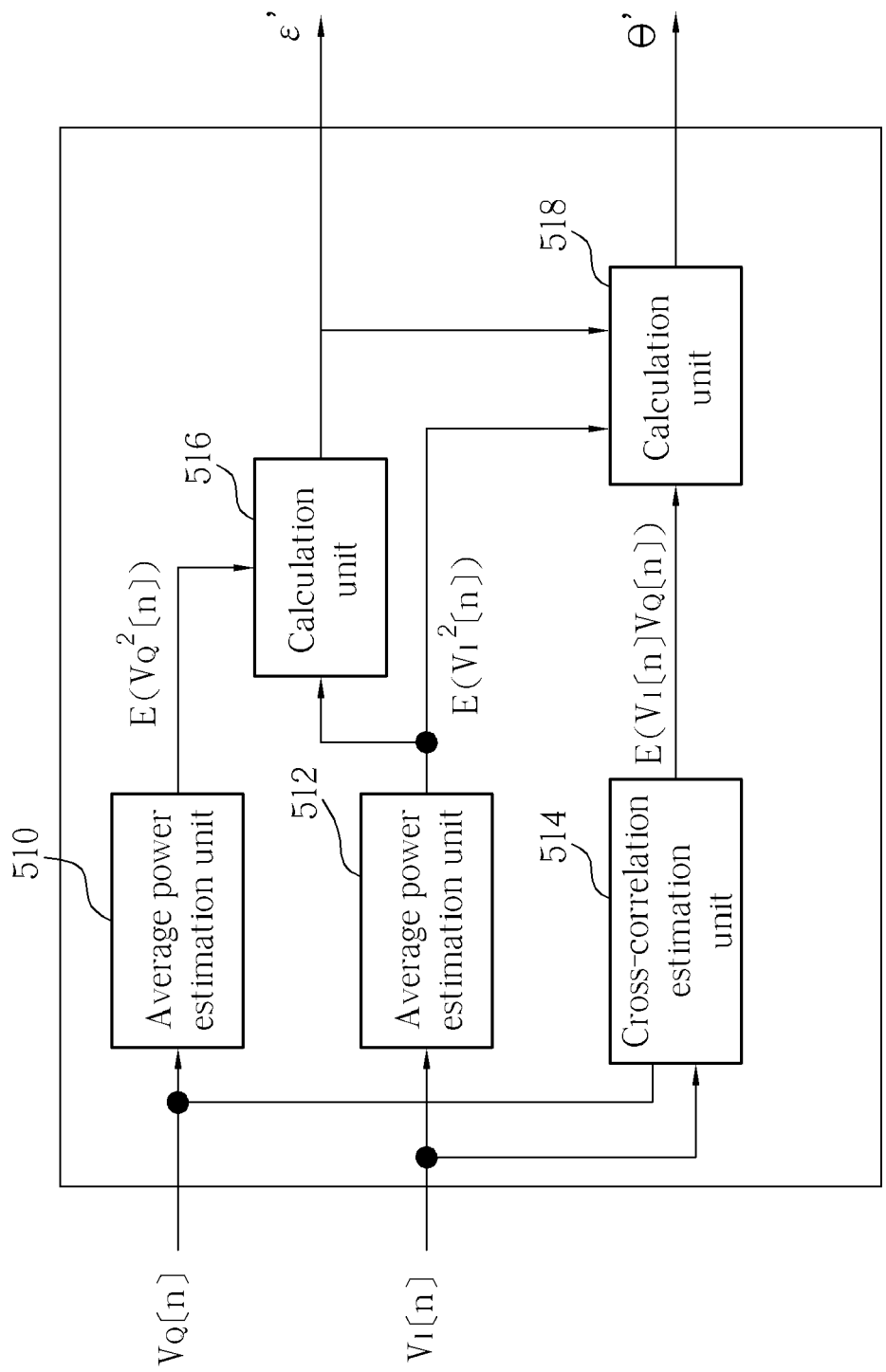
FIG. 3 is a diagram of an in-phase and quadrature-phase parameter estimation unit according to the present invention.

Please refer to FIG. 3, which is a diagram of the in-phase and quadrature-phase imbalance parameter estimation unit 422 shown in FIG. 2 The in-phase analog signal $V_I(t)$ and the quadrature-phase analog signal $V_Q(t)$ are digitized by the ADCs to generate an in-phase digital signal $V_I[n]$ and a quadrature-phase digital signal $V_Q[n]$ respectively, then input to the in-phase and quadrature-phase imbalance parameter estimation unit 422. The average power estimation units 512 and 510, respectively, estimates the power ($V_I^2[n]$) of the in-phase digital signal $V_I[n]$ and the power ($V_Q^2[n]$) of the quadrature-phase digital signal $V_Q[n]$ and outputs to the calculation unit 516. The calculation unit 516 calculates the gain compensation value ε' according to the first predetermined functional relationship between $(1+\varepsilon)_2$ and the above-mentioned power values of the two signals $V_I[n]$ and $V_Q[n]$. Furthermore, the cross-correlation estimation unit 514 estimates the product of the in-phase digital signal $V_I[n]$ and the quadrature-phase digital signal $V_Q[n]$ and outputs the product to the calculation unit 518. The calculation unit 518 calculates the desired phase compensation value θ' according to a second predetermined functional relationship between $-(1+\varepsilon)\cdot E(r_I^2(t))\cdot\sin\theta$ and the product.

The equations (26) and (27) respectively show the equations for obtaining the gain compensation value ε' and the phase compensation value θ' which is performed by the in-phase and quadrature-phase imbalance parameter estimation unit 422:

$$\varepsilon' = \left[\frac{E[V_Q^2[n]]}{E[V_I^2[n]]}\right]^{\frac{1}{2}} - 1$$ Equation (26)

$$\theta' = \sin^{-1}\left(\frac{-E[V_I[n]\cdot V_Q[n]]}{(1+\varepsilon')E[V_I^2[n]]}\right)$$ Equation (27)

Finally, the compensation unit 412 compensates the in-phase digital signal $V_I[n]$ and the quadrature-phase digital signal $V_Q[n]$ according to the gain compensation value ε' and the phase compensation value θ' estimated by the in-phase and quadrature-phase imbalance estimation unit 422 to generate the compensated signals which eliminates the influence of the gain imbalance ε and the phase imbalance θ. The equations for the above compensation are shown as following:

$$S_I[n] = V_I[n]$$ Equation (28)

$$S_Q[n] = \frac{1}{\cos(\theta')}\left(\frac{V_Q[n]}{1+\varepsilon'} + V_I[n]\sin(\theta')\right)$$ Equation (29)

In contrast to the related art, the present invention of the receiver and method capable of compensating IQ imbalance effectively estimates a gain imbalance and a phase imbalance while at the same time a carrier frequency offset also exists. Furthermore, the present invention method and receiver capable of compensating the IQ imbalance can utilize an inverse matrix to multiply an in-phase analog signal and a quadrature-phase analog signal output by a mixer module in order to eliminate the IQ imbalance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for compensating IQ imbalance, the method being utilized for compensating a phase imbalance and a gain imbalance between an in-phase carrier and a quadrature-phase carrier, the method comprising:

mixing a radio frequency signal according to the in-phase carrier and quadrature-phase carrier, respectively, to generate an in-phase analog signal and a quadrature-phase analog signal, respectively, wherein a frequency offset exists between a carrier frequency of the RF signal and a frequency of the in-phase carrier and the frequency offset is also between the carrier frequency of the RF signal and a frequency of the quadrature-phase analog signal;

calculating a gain compensation value and a phase compensation value according to the in-phase analog signal and the quadrature-phase analog signal, wherein the gain compensation value is calculated according to a first predetermined functional relationship that $(1+\epsilon)^2$ equals to a ratio of an average power of an in-phase digital signal to an average power of a quadrature-phase digital signal, wherein $\epsilon$ is the gain compensation value, the in-phase digital signal corresponds to the in-phase analog signal, and the quadrature-phase digital signal corresponds to the quadrature-phase analog signal; and utilizing the gain compensation value to compensate the gain imbalance and utilizing the phase compensation value to compensate the phase imbalance.

2. The method of claim 1, further comprising:
converting the in-phase analog signal into the in-phase digital signal; and
converting the quadrature-phase analog signal into the quadrature-phase digital signal.

3. The method of claim 2, wherein the step of calculating the gain compensation value and the phase compensation value comprises calculating the gain compensation value according to the power of the in-phase digital signal and the power of the quadrature-phase digital signal and calculating the phase compensation value according to a cross-correlation between the in-phase digital signal and the quadrature digital signal.

4. The method of claim 3, wherein the phase compensation value is calculated according to a second predetermined functional relationship that $-(1\epsilon)\cdot E(V_1^2[n])\cdot \sin\theta$ equals to a product of the in-phase digital signal and the quadrature-phase digital signal, wherein $\theta$ is the phase compensation value, and $E(V_1^2[n])$ is the average power of the in-phase digital signal.

5. The method of claim 1, being utilized in an orthogonal frequency division multiplexing (OFDM) communication system.

6. A receiver capable of compensating IQ imbalance, the receiver being utilized for compensating a gain imbalance and a phase imbalance between an in-phase carrier and a quadrature-phase carrier, the receiver comprising:

a mixer module for mixing an RF signal according to the in-phase carrier and the quadrature-phase carrier to generate an in-phase analog signal and a quadrature-phase analog signal respectively, wherein a frequency offset exists between a carrier frequency of the RF signal and a frequency of the in-phase carrier, and the frequency offset exists between the carrier frequency of the RF signal and a frequency of the quadrature-phase carrier;

an in-phase and quadrature-phase imbalance parameter estimation unit, coupled to the mixer module, for estimating a gain compensation value and a phase compensation value according to the in-phase analog signal and the quadrature-phase analog signal, wherein the in-phase and quadrature-phase imbalance parameter estimation unit estimates the gain compensation value according a first predetermined functional relationship that $(1+\epsilon)^2$ equals to a ratio of an average power of an in-phase digital signal to an average power of a quadrature-phase digital signal, wherein $\epsilon$ is the gain compensation value, the in-phase digital signal corresponds to the in-phase analog signal, and the quadrature-phase digital signal corresponds to the quadrature-phase analog signal; and a signal compensation module, coupled to the in-phase and quadrature-phase imbalance parameter estimation unit, for compensating the gain imbalance according to the gain compensation value and compensating the phase imbalance according to the phase compensation value.

7. The receiver of claim 6, further comprising:
a first analog-to-digital converter, coupled to the mixer module, for converting the in-phase analog signal into the in-phase digital signal; and
a second analog-to-digital converter, coupled to the mixer module, for converting the quadrature-phase signal into the quadrature-phase digital signal.

8. The receiver of claim 7, wherein the in-phase and quadrature-phase imbalance parameter estimation unit comprises:
a first average power estimation unit, coupled to the first analog-to-digital converter, for estimating the average power of the in-phase digital signal;
a second average power estimation unit, coupled to the second analog-to-digital converter for estimating the average power of the quadrature-phase digital signal;
a cross-correlation estimation unit, respectively coupled to the first analog-to-digital converter and the second analog-to-digital converter, for estimating a cross-correlation between the in-phase digital signal and the quadrature-phase digital signal;
a first calculation unit, respectively coupled to the first average power estimation unit and the second average power estimation unit for calculating the gain compensation value according to the first predetermined functional relationship corresponding to the average power of the in-phase digital signal and the average power of the quadrature-phase digital signal; and
a second calculation unit, respectively coupled to the first calculation unit, the first average power estimation unit, and the cross-correlation estimation unit, for calculating the phase compensation value according to a second predetermined functional relationship corresponding to the cross-correlation between the in-phase digital signal and the quadrature-phase digital signal.

9. The receiver of claim 8, wherein the first calculation unit calculates the gain compensation value according the first predetermined functional relationship that $(1+\epsilon)^2$ equals to the ratio of the average power of the in-phase digital signal to the average power of the quadrature-phase digital signal.

10. The receiver of claim 8, wherein the second calculation unit calculates the phase compensation value $\theta$ according to the second predetermined functional relationship that $-(1+\epsilon)\cdot E(V_1^2[n])\cdot \sin\theta$ equals to a product of the in-phase digital signal and the quadrature-phase digital signal, wherein $\theta$ is the phase compensation value and $E(V_1^2[n])$ is the average power of the in-phase digital signal.

11. The receiver of claim 6, wherein the receiver is in an orthogonal frequency division multiplexing (OFDM) communication system.

* * * * *